(12) United States Patent
Morgan

(10) Patent No.: US 9,583,616 B2
(45) Date of Patent: Feb. 28, 2017

(54) SEMICONDUCTOR STRUCTURE INCLUDING BACKGATE REGIONS AND METHOD FOR THE FORMATION THEREOF

(71) Applicant: GLOBALFOUNDRIES Inc., Grand Cayman (KY)

(72) Inventor: John Morgan, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/643,326

(22) Filed: Mar. 10, 2015

(65) Prior Publication Data

US 2016/0268424 A1 Sep. 15, 2016

(51) Int. Cl.

| H01L 27/12 | (2006.01) |
|---|---|
| H01L 29/78 | (2006.01) |
| H01L 27/092 | (2006.01) |
| H01L 29/06 | (2006.01) |
| H01L 21/265 | (2006.01) |
| H01L 21/8238 | (2006.01) |
| H01L 21/84 | (2006.01) |

(52) U.S. Cl.
CPC ......... *H01L 29/7831* (2013.01); *H01L 21/265* (2013.01); *H01L 21/823871* (2013.01); *H01L 21/823878* (2013.01); *H01L 21/823892* (2013.01); *H01L 21/84* (2013.01); *H01L 27/0922* (2013.01); *H01L 29/0649* (2013.01)

(58) Field of Classification Search
CPC ............. H01L 27/1203; H01L 27/1207; H01L 27/1211

See application file for complete search history.

(56) References Cited

U.S. PATENT DOCUMENTS

| 2014/0319648 A1* | 10/2014 | Renouillet-Beranger | H01L 27/0259 257/526 |
| 2015/0061006 A1* | 3/2015 | Shinohara | H01L 29/7824 257/336 |

* cited by examiner

*Primary Examiner* — Jae Lee
(74) *Attorney, Agent, or Firm* — Amerson Law Firm, PLLC

(57) ABSTRACT

A semiconductor structure includes a semiconductor substrate, a plurality of transistors and an electrically insulating layer provided between the substrate and the plurality of transistors, and a trench isolation structure including a portion between a first and a second island of the semiconductor structure and extending into the substrate to a first depth. The substrate includes a bottom region having a first type of doping and extending at least to a second depth greater than the first depth, and a deep well region having a second type of doping and extending to a third depth greater than the first depth and smaller than the second depth. Each of the first and second islands includes a first backgate region having the first type of doping and being continuous with the bottom region and a second backgate region having the second type of doping and being continuous with the deep well region.

21 Claims, 6 Drawing Sheets

US 9,583,616 B2

SEMICONDUCTOR STRUCTURE INCLUDING BACKGATE REGIONS AND METHOD FOR THE FORMATION THEREOF

BACKGROUND OF THE INVENTION

1. Field of the Invention

Generally, the present disclosure relates to integrated circuits and methods for the formation thereof, and, in particular, to integrated circuits including field effect transistors that are provided over backgate regions and methods for the formation thereof.

2. Description of the Related Art

Integrated circuits include a large number of circuit elements which include, in particular, field effect transistors. In a field effect transistor, a gate electrode is provided that may be separated from a channel region by a gate insulation layer providing an electrical insulation between the gate electrode and the channel region. Adjacent the channel region, a source region and a drain region are formed, which are doped differently than the channel region.

Integrated circuits including field effect transistors may be formed in accordance with the semiconductor-on-insulator (SOI) technology, wherein the source, channel and drain regions of the transistors are formed in a thin semiconductor layer that is separated from a support substrate, which may be a semiconductor substrate, for example a silicon wafer or die, by an electrically insulating layer, which may be a silicon dioxide layer. SOI technology may have some advantages associated therewith, which include a reduced power consumption of an SOI integrated circuit compared to a bulk semiconductor integrated circuit having the same performance.

Additionally, SOI technology may allow doped backgate regions in the support substrate below the electrically insulating layer that separates the support substrate from the semiconductor material of the source, channel and drain regions of the transistors. The type of doping and the dopant concentration in a backgate region provided below a transistor can have an influence on the threshold voltage of the transistor that needs to be applied to the gate electrode of the transistor for switching the transistor between an on-state wherein the transistor has a relatively high electrical conductivity and an off-state. Additionally, the threshold voltage of the transistor can be influenced by applying a bias voltage to the backgate region.

The threshold voltage of a field effect transistor may be related to a leakage current that flows through the transistor in the off-state. Typically, a lower threshold voltage is associated with an increased leakage current, and vice versa. Lowering the threshold voltage of the field effect transistors in an integrated circuit may help to increase the speed of operation of logic gates wherein the transistors are provided, whereas a reduction of the leakage current may help to reduce power consumption.

Grenouillet et al., "UTBB FDSOI transistors with dual STI for a multi-$V_t$ strategy at 20 nm node and below," *IEEE Electron Devices Meeting (IEDM)*, pages 3.6.1 to 3.6.4, 2012, discloses providing P-doped well regions in the support substrate of an SOI integrated circuit. The P-doped well regions are separated from each other by deep trenches. Above each of the P-doped well regions, either N-channel field effect transistors or P-channel field effect transistors are provided, wherein the electrically insulating layer of the SOI structure is provided between the transistors and the P-doped wells. Below the P-doped wells, an N-doped deep well is provided. Additionally, in the P-doped wells, shallow N-doped backgate regions may be provided. Contacts are provided, which allow applying voltages to the deep N-doped well, the P-doped wells and the shallow N-doped backgate regions.

However, the solution described by Grenouillet et. al. has some issues associated therewith. Due to the contacts provided to the P-doped wells and to the shallow N-doped backgate regions in the wells, a large number of contacts needs to be provided, which can significantly increase the area required by the integrated circuit and can reduce the transistor density of the integrated circuit.

Furthermore, the shallow N-doped backgate regions are formed by means of ion implantation, wherein a counter-doping scheme is used, i.e., the shallow N-doped backgate regions are initially doped with the P-doping of the P-doped wells. Accordingly, a relatively high density of N-type dopants may be required for reversing the polarity of the shallow N-doped backgate regions. Accordingly, the implants for forming the shallow N-doped backgate regions may require relatively high doses, so that the total number of ions passing through the surface and the electrically insulating layer of the SOI structure may be about twice that which would be required to just dope the shallow N-doped backgate regions. Accordingly, a number of damages caused by the ions may be increased.

Furthermore, the design of an integrated circuit as described by Grenouillet et. al. may require additional routing for providing electrical connections to contacts to the shallow N-doped backgate regions and the P-doped wells.

The present disclosure provides semiconductor structures and methods that may help to overcome or at least reduce some or all of the above-mentioned issues of the prior art.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

An illustrative semiconductor structure disclosed herein includes a semiconductor substrate, a plurality of transistors and an electrically insulating layer provided between the substrate and the plurality of transistors. Additionally, the semiconductor structure includes a trench isolation structure that includes a portion between a first and a second island of the semiconductor structure and extends into the substrate to a first depth. The substrate includes a bottom region having a first type of doping and extending at least to a second depth greater than the first depth, and a deep well region having a second type of doping and extending to a third depth greater than the first depth and smaller than the second depth. Each of the first island and the second island includes a first backgate region having the first type of doping and being continuous with the bottom region and a second backgate region having the second type of doping and being continuous with the deep well region, the first and second backgate regions being provided in the substrate.

An illustrative method disclosed herein includes providing an SOI structure including a semiconductor substrate, an electrically insulating layer over the substrate and a semiconductor layer over the electrically insulating layer. A first trench isolation structure is formed. The first trench isolation structure defines a first and a second island of the semiconductor structure and extends into the substrate to a first depth. A first ion implantation is performed, wherein ions of a first type of dopant are implanted into the semiconductor structure and wherein a bottom region extending at least to a second depth greater than the first depth is formed in the substrate. A second ion implantation is performed wherein ions of a second type of dopant are implanted into a part of the semiconductor structure and wherein a deep well region extending to a third depth greater than the first depth and smaller than the second depth is formed in the substrate. A third ion implantation is performed wherein ions of the first type of dopant are implanted into a part of each of the first island and the second island and wherein a first backgate region that is continuous with the bottom region is formed in each of the first island and the second island. A fourth ion implantation is performed wherein ions of the second type of dopant are implanted into a part of each of the first and the second island and wherein a second backgate region that is continuous with the deep well region is formed in each of the first island and the second island.

Another illustrative method disclosed herein includes providing an SOI structure. The SOI structure includes a semiconductor substrate, an electrically insulating layer over the substrate and a semiconductor layer over the electrically insulating layer. A first trench isolation structure defining a first island and a second island of the semiconductor structure and extending into the substrate to a first depth is formed. A bottom region of the substrate is provided. The bottom region includes a first type of dopant and extends at least to a second depth greater than the first depth. Ions of a second type of dopant are implanted into a part of the semiconductor structure for forming a deep well region in the substrate, the deep well region extending to a third depth greater than the first depth and smaller than the second depth. Ions of the first type of dopant are implanted into a part of each of the first island and the second island for forming a first backgate region that is continuous with the bottom region in each of the first island and the second island. Ions of the second type of dopant are implanted into a part of each of the first and the second island for forming a second backgate region that is continuous with the deep well region in each of the first island and the second island.

BRIEF DESCRIPTION OF THE DRAWINGS

The disclosure may be understood by reference to the following description taken in conjunction with the accompanying drawings, in which like reference numerals identify like elements, and in which.

Figure 1:
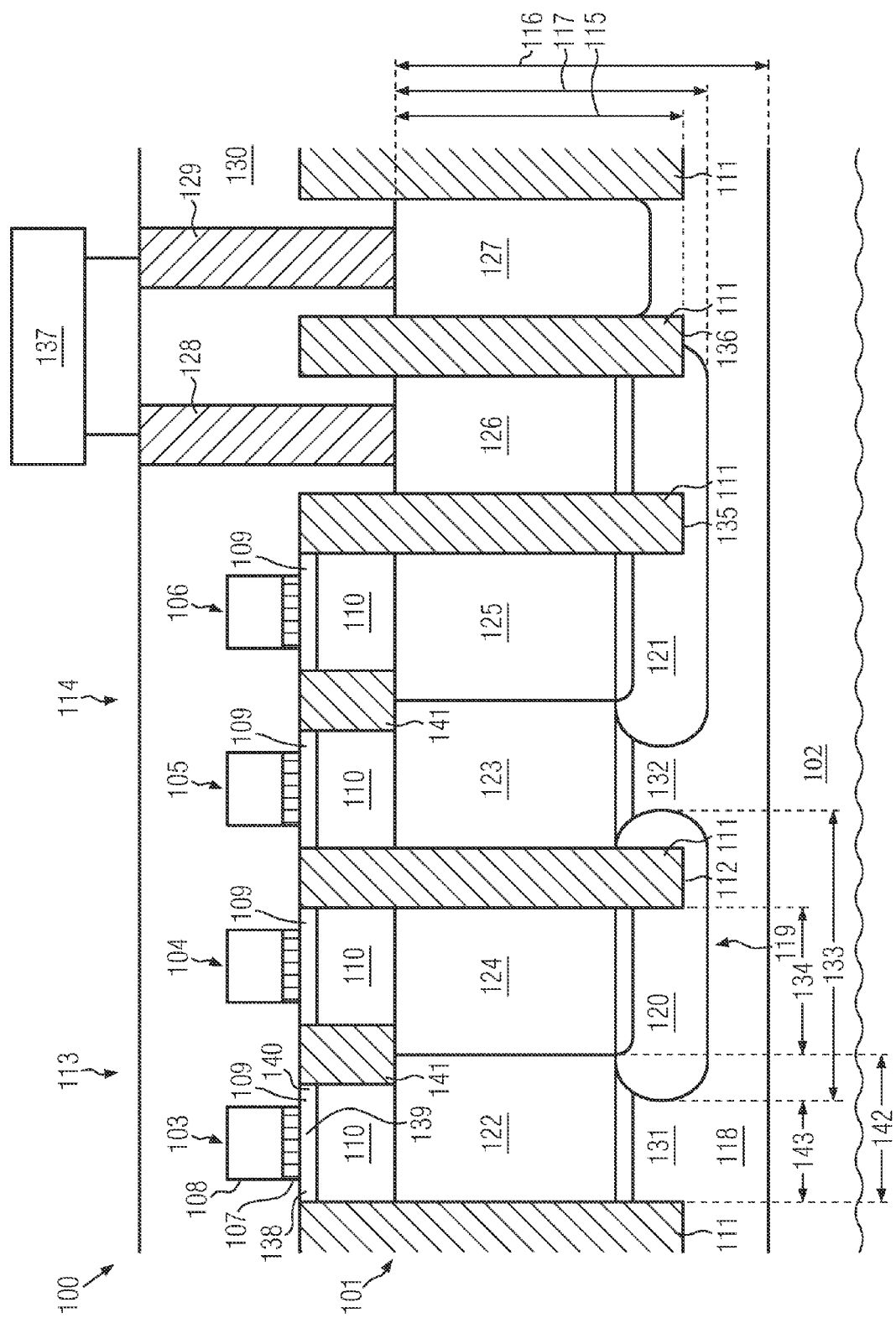
FIG. 1 shows a schematic cross-sectional view of a semiconductor structure according to an embodiment.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

In some embodiments, a feedthrough to an underlying N-doped deep well region and a feedthrough to a P-doped bottom region that may be provided in the form of a P-doped deep well and/or a P-doping of the substrate may be generated by means of an ion implantation and a transistor flavor mask. The feedthrough may use one contact which may be outside an island wherein field effect transistors are provided or in one of a plurality of islands, i.e., one contact and one tap region may be used to supply a bias voltage to a number of islands. Individual sub-islands including doped backgate regions may connect to the buried backplanes provided by the N-doped deep well region and the P-doped bottom region by extending backgate implants to the depth of the backplanes. Thus, the number of contacts may be reduced compared to the integrated circuit described in the section "Description of the Related Art."

An additional advantage of the approach disclosed herein may be that it allows a simple mixing and matching of transistors of different threshold voltage flavors inside of islands without forcing groupings, since sub-islands including transistors having different threshold voltages may be provided without requiring surface area for contacting the backgate.

Furthermore, N-doped backgate regions need not be first implanted with ions of a P-type dopant, so that counterdoping is not required, and the number of (damaging) ions passing through the surface of the SOI structure may be kept to a minimum.

In embodiments disclosed herein, a number of ion implantations need not be greater than in the formation of an integrated circuit as described above in the section "Description of the Related Art." Moreover, some time may be saved for the ion implantations performed for forming the N-doped backgate regions, since no counterdoping needs to be performed.

In embodiments disclosed herein, lower portions of P-doped backgate regions may have a relatively small size, so that N-doped deep well regions provided below N-doped backgate regions may automatically be connected to each other.

FIG. 1 shows a schematic cross-sectional view of a semiconductor structure 100 according to an embodiment. The semiconductor structure 100 includes a semiconductor substrate 102. Above the substrate 102, a plurality of field effect transistors 103, 104, 105, 106 may be provided. The number of transistors 103 to 106 shown in FIG. 1 is of an exemplary nature only. A number of transistors of the semiconductor structure 100 may be greater than the number of transistors shown in FIG. 1. Each of the transistors 103 to 106 may represent a plurality of transistors having features corresponding to those of the respective transistor described herein.

Each of the transistors 103 to 106 may include a gate electrode that is provided above a channel region and separated therefrom by a gate insulation layer. Adjacent the channel region, a source region and a drain region may be provided. In FIG. 1, reference numeral 108 denotes the gate electrode of the transistor 103, reference numeral 107 denotes the gate insulation layer of the transistor 103, and reference numerals 138, 139, 140 denote the source, channel and drain regions, respectively, of the transistor 103. For simplicity, in FIG. 1, reference numerals denoting the gate electrodes, gate insulation layers, source regions, channel regions and drain regions of the transistors 104,105,106 have been omitted, although the respective features are provided in each of the transistors 103 to 106.

Between the substrate 102 and the transistors 103 to 106, an electrically insulating layer 110 may be provided. The channel regions of the transistors 103 to 106 may be provided in a semiconductor layer 109. The semiconductor layer 109, the electrically insulating layer 110 and the substrate 102 form a semiconductor-on-insulator structure 101, wherein the substrate 102 provides a support substrate of the semiconductor-on-insulator structure 101.

The source regions and the drain regions of the transistors 103 to 106 may at least partially be provided in the semiconductor layer 109. Additionally, in some embodiments, the source and drain regions of the transistors 103 to 106 may include raised source and drain regions (not shown in FIG. 1) that may be formed from substantially the same semiconductor material as the semiconductor layer 109 and are provided over the semiconductor layer 109 adjacent the gate electrodes of the transistors 103 to 106.

In some embodiments, the semiconductor layer 109 and the substrate 102 may include silicon and the electrically insulating layer 110 may include silicon dioxide.

The transistors 103, 104 may be N-channel transistors whose source and drain regions have an N-type doping and whose channel regions are P-doped or substantially undoped. The transistors 105, 106 may be P-channel transistors, whose source and drain regions have a P-type doping and whose channel regions have an N-type doping or are substantially undoped.

The semiconductor structure 100 may include islands 113, 114. Each of the islands 113, 114 includes transistors of one type (N-channel or P-channel) only. The island 113 includes N-channel transistors 103, 104 and the island 114 includes P-channel transistors 105, 106.

The semiconductor structure 100 may further include a deep trench isolation structure 111 that includes trenches that are formed in the semiconductor structure 100 and are filled with an electrically insulating material such as, for example, silicon dioxide. The deep trench isolation structure may extend into the substrate 102 to a depth 115, the depth 115 being a distance between an interface between the substrate 102 and the electrically insulating layer 110 and a bottom of the trenches of the deep trench isolation structure 111. The deep trench isolation structure 111 may include a trench 112 being a portion of the deep trench isolation structure 111 that is provided between the islands 113, 114 and provides an electrical insulation between portions of the substrate 102 in the islands 113, 114 that are located in the vicinity of the electrically insulating layer 110. Additionally, the deep trench isolation structure 111 may include portions that are arranged between the islands 113, 114 and other islands of the semiconductor structure 100 that are not shown in FIG. 1.

The semiconductor structure 100 may further include a shallow trench isolation structure 141 that provides an electrical insulation between transistors in the same island, for example between transistors 103, 104 in island 113 and transistors 105, 106 in island 114. The shallow trench isolation structure 141 may include trenches formed in the semiconductor structure 100 that are filled with an electrically insulating material such as silicon dioxide. The shallow trench isolation structure 141 may be shallower than the deep trench isolation structure 111. For example, the shallow trench isolation structure 141 may extend through the semiconductor layer 109 and the electrically insulating layer 110 only, and it need not extend into the substrate 102, or it may extend into the substrate 102 to a depth that is substantially smaller than the depth 115 of the deep trench isolation structure 111.

The substrate 102 MAY include a bottom region 118. The bottom region 118 may have a first type of doping. In some embodiments, the bottom region 118 may be P-doped. The bottom region 118 may extend into the substrate 102 at least to a depth 116 that is greater than the depth 115 of the deep trench isolation structure 111.

In some embodiments, both the bottom region 118 and a portion of the substrate 102 below the bottom region 118 may be P-doped, wherein a dopant concentration in the bottom region 118 is greater than a dopant concentration in portions of the substrate 102 below the bottom region 118. In such embodiments, the depth 116 may represent a distance between the interface between the substrate 102 and the electrically insulating layer 110 and a location in the substrate 102 wherein the concentration of the dopant of the bottom region 118 has substantially decreased to the dopant concentration in the portion of the substrate 102 below the bottom region 118.

In other embodiments, the bottom region 118 may be provided by a P-type base doping of the substrate 102. In such embodiments, the bottom region 118 may extend substantially to a surface of the substrate 102 that is opposite the electrically insulating layer 110 and the semiconductor layer 109.

The substrate 102 may further include a deep well region 119. The deep well region 119 may have a second type of doping that is opposite to the doping of the bottom region 118. In embodiments wherein the bottom region 118 is P-doped, the deep well region 119 may be N-doped. The deep well region 119 may extend into the substrate 102 to a depth 117. The depth 117 may represent a distance between the interface between the substrate 102 and the electrically insulating layer 110 and a PN transition between the doping of the deep well region 119 and the doping of the bottom region 118 at a lower side of the deep well region 119.

The depth 117 of the deep well region 119 may be greater than the depth 115 of the deep trench isolation structure 111 and smaller than the depth 116 of the bottom region 118. Thus, the deep well region 119 may include portions that are below the trenches of the trench isolation structure 111 and provide an electrically conductive path between portions of the deep well region 119 that are arranged on opposite side of the trenches of the deep trench isolation structure 111, so that portions of the deep well region 119 on opposite sides of trenches of the deep trench isolation structure 111 are continuous with each other.

Herein, doped portions of the substrate 102 are denoted as "continuous with each other" if both doped portions of the substrate 102 have the same type of doping and there is an electrically conductive path of the same type of doping and without a PN transition therebetween.

Similarly, the bottom region 118 may include portions below the deep trench isolation structure 111 and the deep well region 119, so that there is an electrically conductive path between portions of the bottom region 118 on opposite sides of the deep well region 119 and/or the deep trench isolation structure 111, and portions of the bottom region 118 on opposite sides of the deep well region 119 and/or the deep trench isolation structure 111 are continuous with each other.

The deep well region 119 may include a portion 120 provided at the island 113 and a portion 121 provided at the island 114. As will be explained in more detail below with reference to FIG. 2, the portions 120, 121 may be continuous with each other and with portions of the deep well region 119 at other islands of the semiconductor structure 100 that are not shown in FIG. 1.

As shown in FIG. 1, the portion 120 of the deep well region 119 at the island 113 may extend below the trench 112 of the deep trench isolation structure 111 between the islands 113, 114, and it may even extend below the island 114 to a certain extent.

The bottom region 118 may include a portion 131 at the island 113 and a portion 132 at the island 114 that are continuous with each other.

The substrate 102 may further include backgate regions 122 and 123, which are provided in the island 113 and in the island 114 of the semiconductor structure 100, respectively. The backgate regions 122, 123 may have a doping of the same type as the bottom region 118. In embodiments wherein the bottom region 118 is P-doped, the backgate regions 122, 123 may also be P-doped.

The backgate region 122 may be provided over the portion 131 of the bottom region 118 at the island 113, and may be continuous therewith. In some embodiments, there may be an overlap between the backgate region 122 and the portion 131 of the bottom region 118 at the island 113.

The backgate region 123 may be provided over the portion 132 of the bottom region 118 at the island 114, and may be continuous therewith. In some embodiments, there may be an overlap between the backgate region 123 and the portion 132 of the bottom region 118 at the island 114.

The backgate regions 122, 123 may extend between the bottom region 118 and the electrically insulating layer 110, so that there are portions of the backgate regions 122, 123 which are directly adjacent the electrically insulating layer 110 and in a vicinity of the source, channel and drain regions of the transistors 103, 105 that are provided above the backgate regions 122, 123.

The substrate 102 may further include backgate regions 124, 125 that are provided in the island 113 and in the island 114, respectively. A doping of the backgate regions 124, 125 may be a doping of the same type as the doping of the deep well region 119. In embodiments wherein the deep well region 119 is N-doped, the backgate regions 124, 125 may also be N-doped.

The backgate region 124 may be provided over the portion 120 of the deep well region 119 at the island 113, and may be continuous therewith. In some embodiments, the backgate region 124 may have an overlap with the portion 120 of the deep well region 119 at the island 113.

The backgate region 125 may be provided over the portion 121 of the deep well region 119 at the island 114, and may be continuous therewith. In some embodiments, the backgate region 125 may have an overlap with the portion 121 of the deep well region 119 at the island 114.

The backgate regions 124, 125 may extend between the deep well region 119 and the electrically insulating layer 110, so that the backgate regions 124, 125 may be directly adjacent the electrically insulating layer 110 and in a vicinity of the source, channel and drain regions of the transistors 104, 106 that are arranged above the backgate regions 124, 125.

In FIG. 1, reference numeral 133 denotes an extension of the portion 120 of the deep well region 119 provided at the island 113 of the semiconductor structure 100 in a horizontal direction that is horizontal in the plane of drawing of FIG. 1. Herein, the wording "horizontal direction" is used to denote a direction that is substantially perpendicular to a thickness direction of the substrate 102, wherein an extension of the substrate 102 in the thickness direction is smaller than any extension of the substrate 102 in any direction other than the thickness direction. In the plane of drawing of FIG. 1, the thickness direction of the substrate 102 is vertical, and there is a first horizontal direction that is horizontal in the plane of drawing of FIG. 1, and a second horizontal direction that is perpendicular to the plane of drawing of FIG. 1.

The extension of the portion 120 of the deep well region 119 at the island 113 in one or both of the horizontal directions may be greater than an extension of the backgate region 124 in the island 113 in the same horizontal direction. In FIG. 1, reference numeral 134 denotes an extension of the backgate region 124 in the horizontal direction that is horizontal in the plane of drawing of FIG. 1 that is greater than the extension 133 of the portion 120 of the deep well region 119.

Extensions of the portion 131 of the bottom region 118 at the island 113 and/or a lower part of the backgate region 122 at the island 113 in one or more horizontal directions may be smaller than extensions of the upper part of the backgate region 122 in the same one or more horizontal directions. In FIG. 1, reference numeral 143 shows an extension of the backgate region 122 in the horizontal direction that is horizontal in the plane of drawing of FIG. 1 and is smaller than an extension 142 of an upper part of the backgate region 122 in the same horizontal direction.

Similarly, an extension of the portion 121 of the deep well region 119 at the island 114 in at least one horizontal direction may be greater than an extension of the backgate region 125 in the at least one horizontal direction, and an extension of the portion 132 of the bottom region 118 and/or an extension of the lower part of the backgate region 123 at the island 114 in at least one horizontal direction may be smaller than an extension of an upper portion of the backgate region 123 in the at least one horizontal direction.

The semiconductor structure 100 may further include a deep well region contact 128 and a bottom region contact 129. The deep well region contact 128 and the bottom region contact 129 may be provided in the form of contact holes that are formed in an interlayer dielectric 130 and are filled with an electrically conductive material. The interlayer dielectric 130 may include silicon dioxide and/or silicon nitride and the electrically conductive material of the deep well region contact 128 and the bottom region contact 129 may include tungsten and/or aluminum.

The deep well region contact 128 may contact a tap region 126 that is formed in the substrate 102. The tap region 126 may have a doping of the same type as the deep well region 119 and it may be continuous with the deep well region 119. In embodiments wherein the deep well region 119 is N-doped, the tap region 126 may also be N-doped. The tap region 126 may extend between the deep well region 119 and an interface between the substrate 102 and the deep well region contact 128, so that there is an N-doped electrically conductive path between the deep well region contact 128 and the deep well region 119. Since, as already mentioned above, the portion 120 of the deep well region 119 at the island 113 and the portion 121 of the deep well region 119 at the island 114 may be continuous with each other, the deep well region contact 128 and the tap region 126 may provide a common electrical contact to the portions 120, 121 of the deep well region 119.

The bottom region contact 129 may contact a tap region 127 that is formed in the substrate 102. The tap region 127 may be continuous with the bottom region 118 and a doping of the tap region 127 may be a doping of the same type as the doping of the bottom region 118. In embodiments wherein the bottom region 118 is P-doped, the tap region 127 may also be P-doped. Since the bottom region 118 may extend below the deep well region 119 and the deep trench isolation structure 111, there may be a P-doped electrical path between the tap region 127 and each of the portion 131 of the bottom region 118 below the island 113 and the portion 132 of the bottom region 118 below the island 114. Accordingly, the bottom region contact 129 and the tap region 127 may provide a common electrical contact to the portions 131, 132 of the bottom region 118.

The deep trench isolation structure 111 may include a portion 135 that is provided between the tap region 126 and an island adjacent thereof, for example, the island 114, as well as a portion 136 that is arranged between the tap regions 126, 127.

In some embodiments, the portion 135 of the deep trench isolation structure 111 between the tap region 126 and the island 114 may be omitted, so that the tap region 126 is provided in the island 114. Similarly, the tap region 127 may be provided in one of the islands 113, 114 or in another island of the semiconductor structure 100 that is not shown in FIG. 1.

In the operation of the semiconductor structure 100, a mass potential may be applied to the bottom region contact 129, and a positive voltage, which may be the positive power supply voltage $V_{DD}$ of the semiconductor structure 100, may be applied to the deep well contact 128. Thus, the PN transition between the N-doped portions of the substrate 102 provided by the tap region 126, the deep well region 119 and the backgate regions 124, 125 and the P-doped portions of the substrate 102 provided by the tap region 127, the bottom region 118 and the backgate regions 122, 123 may be biased in the inverse direction so that there is substantially no current flow or only a small current flow.

For applying voltages to the deep well region contact 128 and the bottom region contact 129, a circuit 137 may be provided in the semiconductor structure 100. In FIG. 1, the circuit 137 is schematically shown in a block form. The circuit 137 may include known circuit elements formed in the semiconductor structure 100. Features of the circuit 137 may correspond to features of known circuits for applying voltages in an integrated circuit.

The electric potential applied to the deep well region contact 128 is also applied to the backgate regions 124, 125, and the electric potential applied to the bottom region contact 129 is also applied to the backgate regions 122, 123.

Due to the different doping of the backgate region 122 and the backgate region 124 and due to the different electric potentials applied thereto, a threshold voltage of N-channel transistor 103 may be greater than a threshold voltage of N-channel transistor 104. Thus, transistor 103 may provide a high threshold voltage N-channel transistor, and transistor 104 may provide a regular threshold voltage N-channel transistor or a low threshold voltage N-channel transistor.

Due to the different doping of the backgate regions 123, 125 and due to the different potentials applied thereto, P-channel transistor 105 may have a smaller threshold voltage than P-channel transistor 106, so that transistor 105 may provide a regular threshold voltage P-channel transistor or a low threshold voltage P-channel transistor and transistor 106 may provide a high threshold voltage P-channel transistor.

Accordingly, in each of the islands 113, 114 that include N-channel transistors and P-channel transistors, respectively, transistors having different threshold voltages may be provided.

Figure 2:
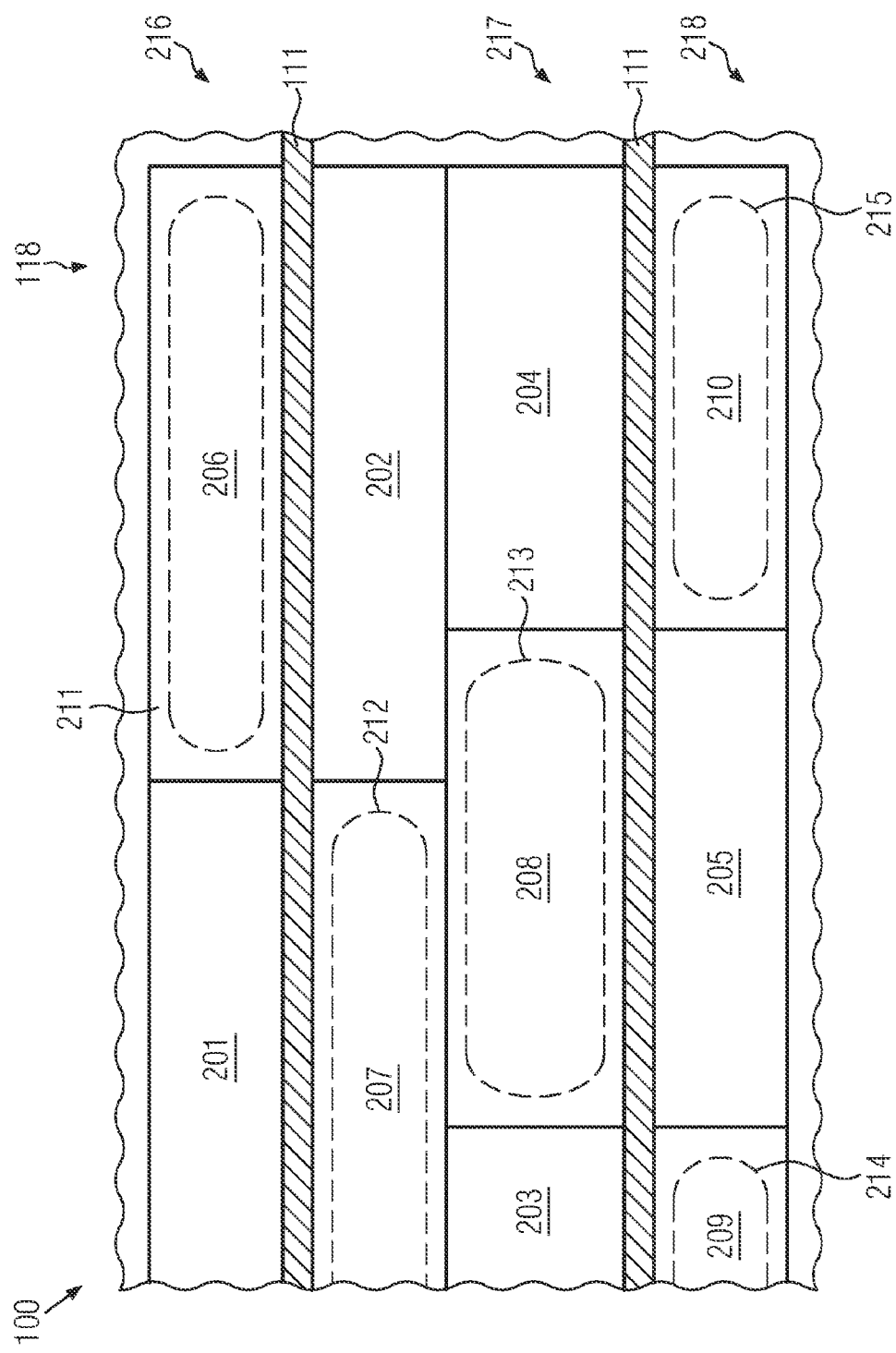
FIG. 2 shows a schematic top view of the semiconductor structure shown in FIG. 1.

FIG. 2 shows a schematic top view of the semiconductor structure 100. For convenience, in FIG. 2, details of the semiconductor structure 100 as shown in FIG. 1 have been omitted. Instead, FIG. 2 illustrates the arrangement of islands and doped backgate regions. In FIG. 2, reference numerals 216, 217, 218 denote islands similar to islands 113, 114 shown in FIG. 1 that are separated by the deep trench isolation structure 111. In FIG. 2, the extension of the island 217 between portions of the deep trench isolation structure 111 on opposite sides of the island 217 is shown, whereas only parts of the islands 216, 218 adjacent the island 217 are shown. Moreover, FIG. 2 shows only parts of the extension of the islands 216, 217, 218 in a direction that corresponds to the horizontal direction in the plane of drawing of FIG. 2.

Each of the islands 216, 217, 218 may include field effect transistors of one type, i.e., either N-channel transistors or P-channel transistors. For example, islands 216, 218 may include N-channel transistors, similar to island 113 shown in FIG. 1, and island 217 may include P-channel transistors, similar to island 114 shown in FIG. 1.

Each of the islands 216, 217, 218 may include differently doped backgate regions. Island 216 may include an N-doped backgate region 201 similar to backgate region 124 shown in FIG. 1, and a P-doped backgate region 206 similar to backgate region 122 shown in FIG. 1.

Island 217 may include N-doped backgate regions 202, 203, 204 similar to backgate region 125 shown in FIG. 1 and P-doped backgate regions 207, 208 similar to backgate region 123 shown in FIG. 1.

Island 218 may include an N-doped backgate region 205 similar to backgate region 124 shown in FIG. 1 and P-doped backgate regions 209, 210 similar to backgate region 122 shown in FIG. 1.

In islands 216, 218 including N-channel transistors, regular threshold voltage field effect transistors and/or low threshold voltage field effect transistors may be provided over the N-doped backgate regions 201, 205, and high threshold voltage field effect transistors may be provided over the P-doped backgate regions 206, 209, 210. In island 217 including P-channel transistors, regular threshold voltage field effect transistors and/or low threshold voltage field effect transistors may be provided over the P-doped backgate regions 207, 208, and high threshold voltage P-channel field effect transistors may be provided over the N-doped backgate regions 202, 203, 204.

Below each of the N-doped backgate regions 201 to 205, a portion of the deep well region 119 similar to the portions 120, 121 of the deep well region 119 shown in FIG. 1 may be provided. Below each of the P-doped backgate regions 206 to 210, a portion of the bottom region 118 similar to the portions 131, 132 of the bottom region 118 shown in FIG. 1 may be provided. Transitions between the deep well region 119 and the bottom region 118 at lateral sides thereof are denoted by dashed lines 211 to 215 in FIG. 2.

As can be seen from FIG. 2, since the extensions of the portions of the deep well region 119 below the N-doped backgate regions 201 to 205 in the horizontal directions (horizontal and vertical in FIG. 2) are greater than the extensions of the N-doped backgate regions 201 to 205 in the horizontal directions, the portions of the deep well region 119 may be continuous with each other. Therefore, a single deep well region contact, such as deep well region contact 128 shown in FIG. 1, may be sufficient to supply a plurality of N-doped backgate regions. Similarly, since the portions of the bottom region 118 below the P-doped backgate regions 206 to 210 are continuous with each other, a single bottom region contact, such as bottom region contact 129 shown in FIG. 1, may be sufficient to supply a plurality of P-doped backgate regions.

A smaller one of the horizontal extensions of each of the backgate regions 201 to 210, being an extension in a direction corresponding to the vertical direction in the plane of drawing of FIG. 2, may be greater than a minimum width and space of deep well implants. In some embodiments, the minimum width and depth of deep well implants may be about 200 nm, and the smaller one of the horizontal extensions of each of the backgate regions 201 to 210 may be about 600 nm or more.

In the following, methods that may be used in the formation of the semiconductor structure 100 described above with reference to FIGS. 1 and 2 will be described with reference to FIGS. 3 to 6.

Figure 3:
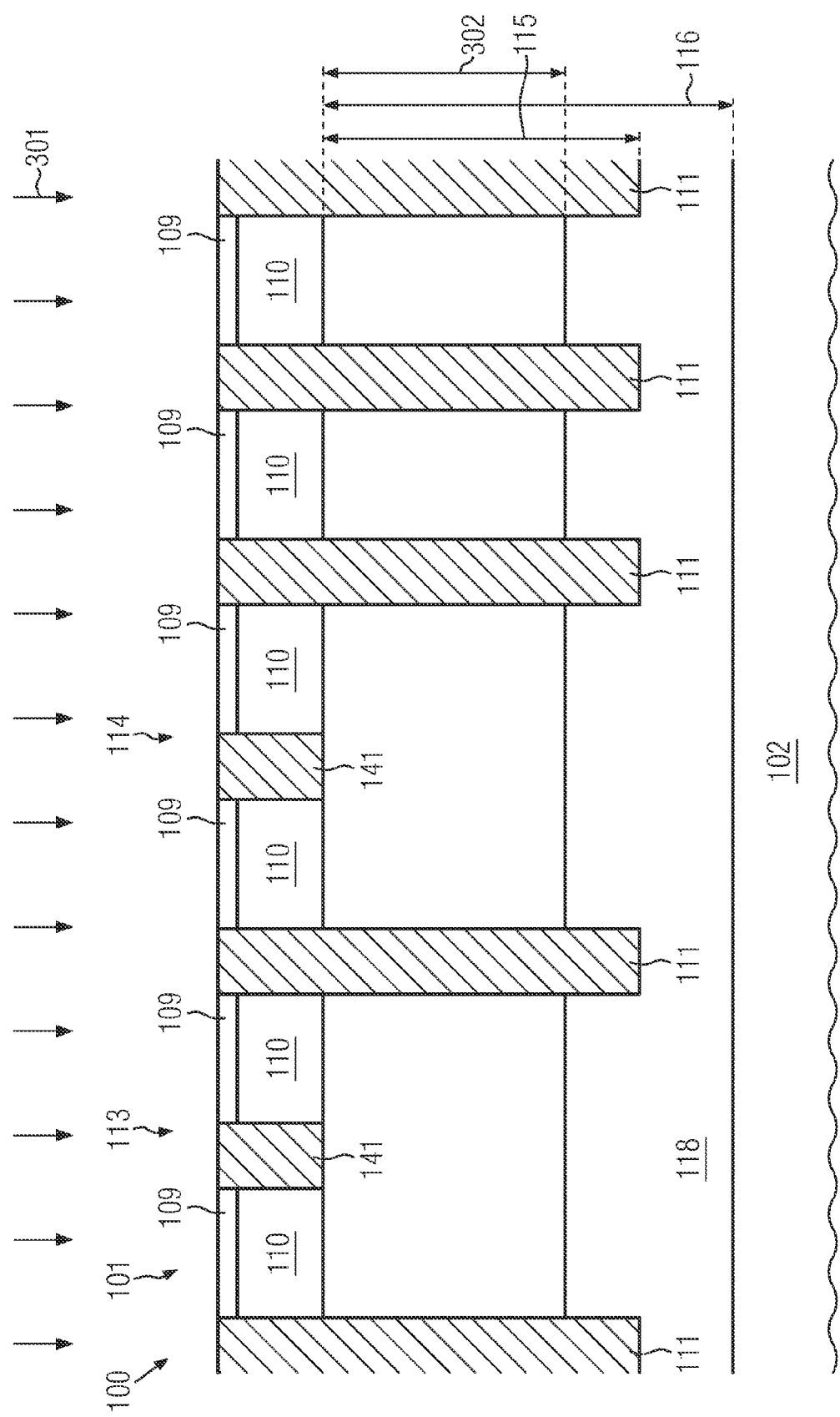
FIGS. 3-6 show schematic, cross-sectional views of the semiconductor structure shown in FIGS. 1 and 2 in stages of a method according an embodiment.

FIG. 3 shows a schematic cross-sectional view of the semiconductor structure 100 in a stage of a manufacturing process according to the embodiment. Semiconductor-on-insulator structure 101 may be provided, wherein the semiconductor-on-insulator structure 101 includes the substrate 102, being a support substrate of the semiconductor-on-insulator structure 101, the electrically insulating layer 110 and the semiconductor layer 109. For providing the semiconductor-on-insulator structure 101, known techniques for forming semiconductor-on-insulator structures may be used.

The deep trench isolation structure 111 and the shallow trench isolation structure 141 may be formed. For this purpose, known techniques for the formation of trench isolation structures, which may include photolithography, etching, oxidation, deposition and/or chemical mechanical polishing, may be used.

Thereafter, a blanket ion implantation, that is schematically denoted by arrows 301 in FIG. 3, may be performed. In the ion implantation 301, substantially the entire semiconductor structure 100 may be irradiated with ions of a dopant for providing the doping of the bottom region 118. In embodiments wherein the bottom region 118 is P-doped, boron ions may be implanted into the semiconductor structure 100.

An energy of the ions used in the ion implantation 301 may be adapted such that a majority of the ions comes to rest in a region of the substrate 102 between the depth 116 of the bottom region 118 described above with reference to FIG. 1 and a smaller depth 302 that may be smaller than the depth 115 of the deep trench isolation structure 111. Thus, the bottom region 118 may be formed in the substrate 102.

In embodiments wherein the bottom region 118 is provided by a base P-type doping of the substrate 102 only, the ion implantation 301 may be omitted.

Figure 4:
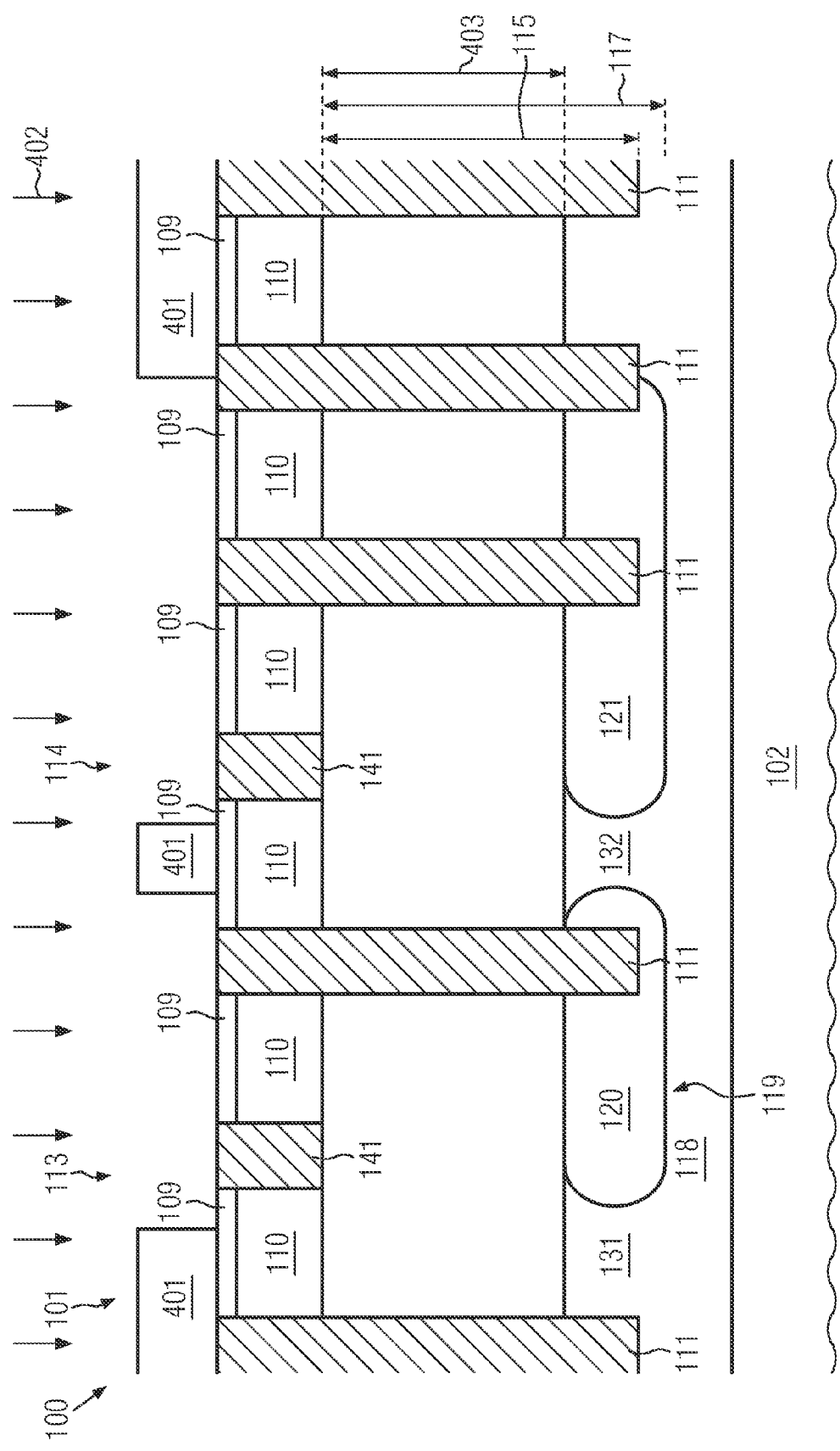

FIG. 4 shows a schematic cross-sectional view of the semiconductor structure 100 in a later stage of the manufacturing process. A deep well implantation mask 401 may be formed over the semiconductor structure 100. The deep well implantation mask 401 may be a photoresist mask, and it may be formed by means of known techniques of photolithography. The deep well implantation mask 401 may cover portions of the semiconductor structure 100 other than those wherein deep well region 119 is to be formed in the substrate 102. In particular, the deep well implantation mask 401 may cover portions of the islands 113, 114 wherein the portions 131, 132 of the bottom region 118 and/or lower parts of the backgate regions 122, 123 are to be provided and portions of the semiconductor structure 100 wherein the tap region 127 is to be provided.

After the formation of the deep well implantation mask 401, an ion implantation 402 may be performed for forming the deep well region 119. In the ion implantation 402, ions of a dopant that is used for doping the deep well region 119 may be implanted into the semiconductor structure 100. In embodiments wherein the deep well region 119 is N-doped, ions of phosphorus or arsenic may be implanted into the semiconductor structure 100 in the ion implantation 402. An energy of the ions may be adapted such that a majority of the ions comes to rest in a region of the substrate 102 between the depth 117 of the deep well region 119 described above with reference to FIG. 1 and a smaller depth 403, which may be smaller than the depth 115 of the deep trench isolation structure 111. In some embodiments, the depth 403 may be approximately equal to the depth 302 (FIG. 3).

Figure 5:
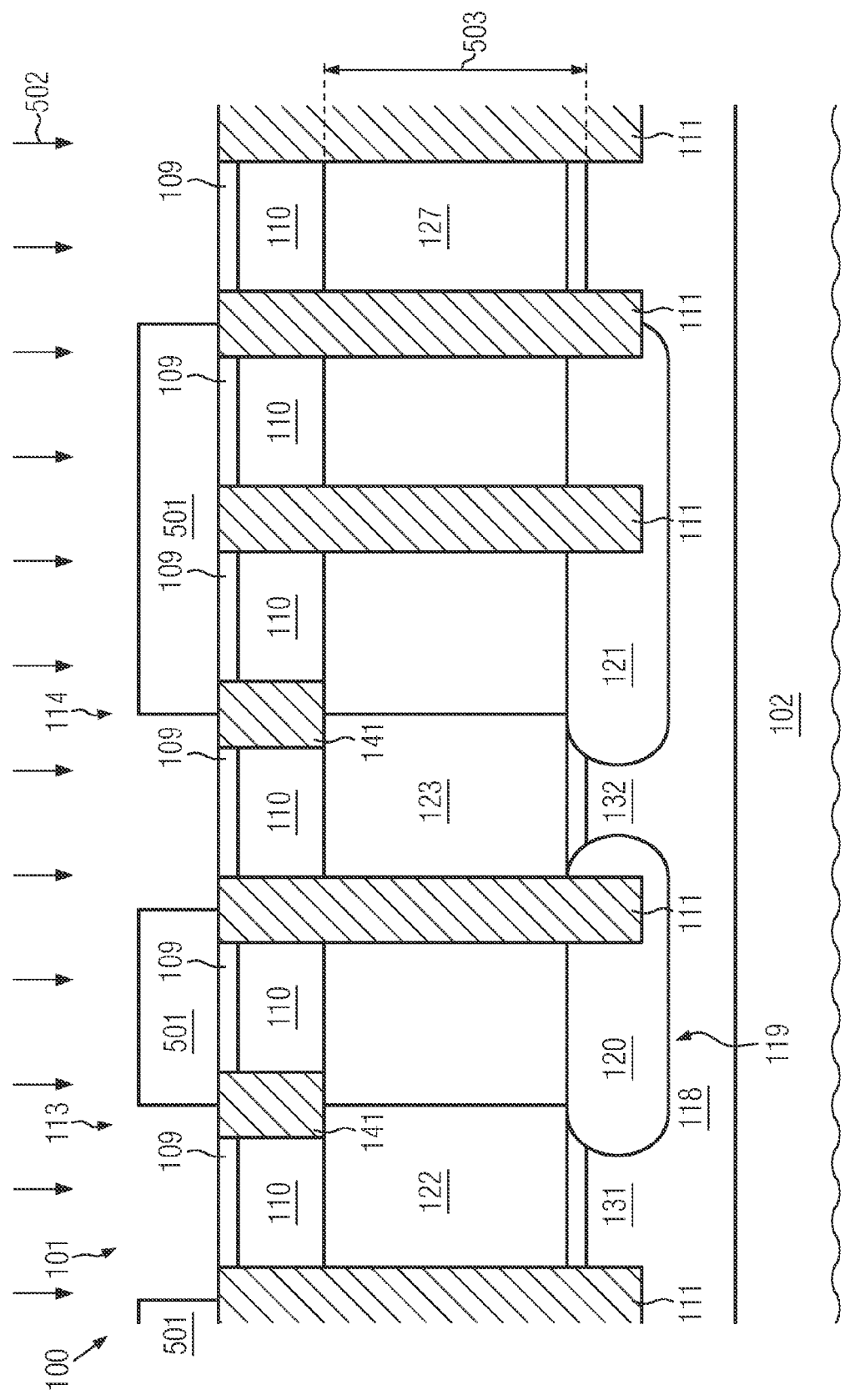

FIG. 5 shows a schematic cross-sectional view of the semiconductor structure 100 in a later stage of the manufacturing process. After the ion implantation 402 wherein the deep well region 119 is formed, the deep well implantation mask 401 may be removed and a transistor flavor mask 501 may be formed over the semiconductor structure 100. The transistor flavor mask 501 may be a photomask and it may be formed by means of a photolithography process. The transistor flavor mask 501 may cover portions of the semiconductor structure 100 other than those portions wherein the backgate regions 122, 123 and the tap region 127 are to be formed. In particular, the transistor flavor mask 501 may cover portions of the semiconductor structure 100 wherein the backgate regions 124, 125 and the tap region 126 are to be formed.

After the formation of the transistor flavor mask 501, an ion implantation 502 may be performed for implanting ions of a dopant that is used for doping the backgate regions 122, 123 and the tap region 127, for example ions of boron, into the semiconductor structure 100. In the ion implantation 502, the backgate regions 122, 123 and the tap region 127 may be formed. An ion implantation energy of the ion implantation 502 may be adapted such that a majority of the ions comes to rest in the substrate 102 in a region between a depth 503, which may be approximately equal to or slightly greater than the depth 302 (FIG. 3), and the electrically insulating layer 110. Thus, backgate regions 122, 123 and tap region 127 being continuous with the bottom region 118 may be obtained. In some embodiments, the ion implantation energy may be varied during the ion implantation 502 for obtaining a desired dopant profile in the backgate regions 122, 123 and the tap region 127.

Figure 6:
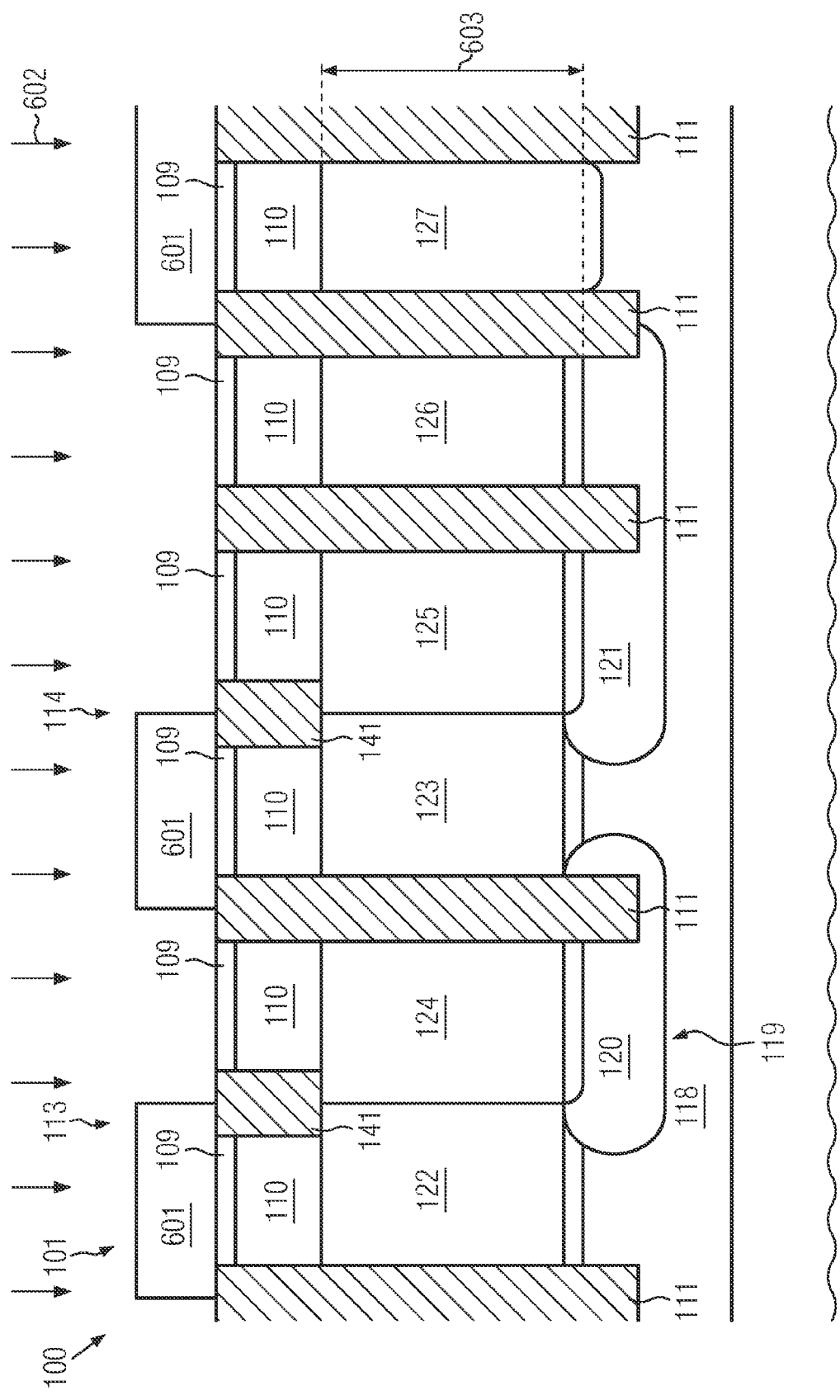

FIG. 6 shows a schematic cross-sectional view of the semiconductor structure 100 in a later stage of the manufacturing process. After the ion implantation 502, the transistor flavor mask 501 may be removed and another transistor flavor mask 601 may be formed over the semiconductor structure 100. The transistor flavor mask 601 may be a photoresist mask and it may be formed by means of a photolithography process. The transistor flavor mask 601 may cover portions of the semiconductor structure 100 other than those portions wherein the backgate regions 124, 125 and the tap region 126 are to be formed. In particular, the transistor flavor mask 601 may cover portions of the semiconductor structure 100 wherein the backgate regions 122, 123 and the tap region 127 are provided.

After the formation of the transistor flavor mask 601, an ion implantation 602 may be performed, wherein the semiconductor structure 100 is irradiated with ions of a dopant that is employed for providing the doping of the backgate regions 124, 125 and the tap region 126. In embodiments wherein the backgate regions 124, 125 and the tap region 126 are N-doped, ions of phosphorous or arsenic may be implanted into the semiconductor structure 100 in the ion implantation 602.

In the ion implantation 602, an ion implantation energy may be adapted such that a majority of the ions comes to rest in the substrate 102 in a region between a depth 603 and the electrically insulating layer 110. The depth 603 may be slightly greater than or approximately equal to the depth 403 (FIG. 4) so that the backgate regions 124, 125 and the tap region 126 are continuous with the deep well region 119. In some embodiments, the ion implantation energy may be varied during the ion implantation 602, so that a desired dopant profile is obtained in the backgate regions 124, 125 and the tap region 126.

Thereafter, the transistor flavor mask 601 may be removed and conventional semiconductor manufacturing techniques may be performed for forming the transistors 103 to 106, for removing portions of the electrically insulating layer 110 and the semiconductor layer 109 over the tap regions 126, 127, and for forming the interlayer dielectric 130, the deep well region contact 128, the bottom region contact 129 and the circuit 137.

The ion implantations 301, 402, 502, 602 need not be performed in the order described above. In other embodiments, the ion implantations 301, 402, 502, 602 may be performed in a different order.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is, therefore, evident that the particular embodiments disclosed above may be altered or modified and all such variations are considered within the scope and spirit of the invention. Accordingly, the protection sought herein is as set forth in the claims below.

What is claimed:

1. A semiconductor structure, comprising:
    a semiconductor substrate, a plurality of transistors and an electrically insulating layer provided between said substrate and said plurality of transistors;
    a first trench isolation structure comprising a portion between a first and a second island of said semiconductor structure and extending into said substrate to a first depth;
    said substrate comprising a bottom region having a first type of doping and extending at least to a second depth greater than said first depth and a deep well region having a second type of doping and extending to a third depth greater than said first depth and smaller than said second depth; and
    each of said first island and said second island comprising a first backgate region disposed above said bottom region, having said first type of doping, and being continuous with said bottom region and a second backgate region disposed above said deep well region, having said second type of doping, and being continuous with said deep well region, said first and second backgate regions being provided in said substrate.

2. The semiconductor structure of claim 1, further comprising:
    a bottom region contact providing an electrical connection to said bottom region; and
    a deep well region contact providing an electrical connection to said deep well region.

3. The semiconductor structure of claim 2, wherein said bottom region comprises a first portion provided at said first island and a second portion provided at said second island, said first portion and said second portion being continuous with each other.

4. The semiconductor structure of claim 3, wherein said bottom region contact is a common bottom region contact providing an electrical connection to said first portion of said bottom region and to said second portion of said bottom region.

5. The semiconductor structure of claim 2, wherein said deep well region comprises a first portion provided at said first island and a second portion provided at said second island, said first portion and said second portion of said deep well region being continuous with each other.

6. The semiconductor structure of claim 5, wherein said deep well region contact is a common deep well region contact providing an electrical connection to said first portion and said second portion of said deep well region.

7. The semiconductor structure of claim 6, wherein, for at least one of said first island and said second island, an extension of the portion of said deep well region provided at the respective island in at least one horizontal direction is greater than an extension of said second backgate region in the respective one of said first island and said second island in said at least one horizontal direction, wherein each of said at least one horizontal direction is perpendicular to a thickness direction of said substrate.

8. The semiconductor structure of claim 2, wherein said first trench isolation structure comprises a portion arranged between said bottom region contact and at least one of said first island and said second island.

9. The semiconductor structure of claim 8, wherein said first trench isolation structure comprises a portion arranged between said deep well region contact and at least one of said first island, said second island and said deep well region contact.

10. The semiconductor structure of claim 1, wherein said plurality of transistors comprises:
a plurality of N-channel field effect transistors provided in said first island, wherein a first subset of said plurality of N-channel field effect transistors is provided over said first backgate region of said first island and a second subset of said plurality of N-channel field effect transistors is provided over said second backgate region of said first island; and
a plurality of P-channel field effect transistors provided in said second island, wherein a first subset of said plurality of P-channel transistors is provided over said first backgate region of said second island and a second subset of said plurality of P-channel transistors is provided over said second backgate region of said second island.

11. The semiconductor structure of claim 10, wherein:
said first type of doping is a P-type doping;
said second type of doping is an N-type doping;
said first subset of said plurality of N-channel field effect transistors comprises high threshold voltage N-channel field effect transistors;
said second subset of said plurality of N-channel field effect transistors comprises at least one of regular threshold voltage N-channel field effect transistors and low threshold voltage N-channel field effect transistors;
said first subset of said plurality of P-channel field effect transistors comprises at least one of regular threshold voltage P-channel field effect transistors and low threshold voltage N-channel field effect transistors; and
said second subset of said plurality of P-channel field effect transistors comprises high threshold voltage P-channel field effect transistors.

12. The semiconductor structure of claim 1, further comprising a circuit for applying a mass potential to said bottom region contact and for applying a positive voltage to said deep well region contact.

13. The semiconductor structure of claim 1, further comprising a second trench isolation structure providing electrical insulation between transistors of said plurality of transistors that are provided in a same island, said second trench isolation structure being smaller than said first trench isolation structure.

14. A semiconductor structure, comprising:
a semiconductor substrate, a plurality of transistors and an electrically insulating layer provided between said substrate and said plurality of transistors;
a first trench isolation structure comprising a portion between a first and a second island of said semiconductor structure and extending into said substrate to a first depth;
said substrate comprising a bottom region having a first type of doping and extending at least to a second depth greater than said first depth and a deep well region having a second type of doping and extending to a third depth greater than said first depth and smaller than said second depth; and
each of said first island and said second island comprising a first backgate region having said first type of doping and being continuous with said bottom region and a second backgate region having said second type of doping and being continuous with said deep well region, said first and second backgate regions being provided in said substrate, wherein, for at least one of said first island and said second island, an extension of the portion of said deep well region provided at the respective island in at least one horizontal direction is greater than an extension of said second backgate region in the respective one of said first island and said second island in said at least one horizontal direction, wherein each of said at least one horizontal direction is perpendicular to a thickness direction of said substrate.

15. The semiconductor structure of claim 14, further comprising:
a bottom region contact providing an electrical connection to said bottom region; and
a deep well region contact providing an electrical connection to said deep well region.

16. The semiconductor structure of claim 15, wherein said bottom region comprises a first portion provided at said first island and a second portion provided at said second island, said first portion and said second portion being continuous with each other and said bottom region contact is a common bottom region contact providing an electrical connection to said first portion of said bottom region and to said second portion of said bottom region.

17. The semiconductor structure of claim 15, wherein said deep well region comprises a first portion provided at said first island and a second portion provided at said second island, said first portion and said second portion of said deep well region being continuous with each other, and said deep well region contact is a common deep well region contact providing an electrical connection to said first portion and said second portion of said deep well region.

18. The semiconductor structure of claim 14, wherein said first trench isolation structure comprises a portion arranged between said bottom region contact and at least one of said first island and said second island.

19. The semiconductor structure of claim 14, wherein said first trench isolation structure comprises a portion arranged between said deep well region contact and at least one of said first island, said second island and said deep well region contact.

20. The semiconductor structure of claim 14, wherein said plurality of transistors comprises:
a plurality of N-channel field effect transistors provided in said first island, wherein a first subset of said plurality of N-channel field effect transistors is provided over said first backgate region of said first island and a second subset of said plurality of N-channel field effect transistors is provided over said second backgate region of said first island; and
a plurality of P-channel field effect transistors provided in said second island, wherein a first subset of said plurality of P-channel transistors is provided over said first backgate region of said second island and a second subset of said plurality of P-channel transistors is provided over said second backgate region of said second island.

21. The semiconductor structure of claim 14, further comprising a second trench isolation structure providing electrical insulation between transistors of said plurality of transistors that are provided in a same island, said second trench isolation structure being smaller than said first trench isolation structure.

* * * * *